(12) United States Patent
Chow

(10) Patent No.: US 7,701,567 B2
(45) Date of Patent: Apr. 20, 2010

(54) OPTOELECTRONIC DISTANCE SENSOR

(75) Inventor: Yeung Ming Chow, Tai Po (HK)

(73) Assignee: Hong Kong Applied Science & Technology Research Institute Co., Ltd., Shatin, New Territories (HK)

( * ) Notice: Subject to any disclaimer, the term of this patent is extended or adjusted under 35 U.S.C. 154(b) by 245 days.

(21) Appl. No.: 12/043,800

(22) Filed: Mar. 6, 2008

(65) Prior Publication Data

US 2009/0225330 A1 Sep. 10, 2009

(51) Int. Cl.
*G01J 1/42* (2006.01)
(52) U.S. Cl. ...................... 356/218; 356/614
(58) Field of Classification Search .......... 356/213–236
See application file for complete search history.

(56) References Cited

U.S. PATENT DOCUMENTS

| | | | | |
|---|---|---|---|---|
| 4,259,018 A | * | 3/1981 | Poirier | 356/625 |
| 5,760,905 A | * | 6/1998 | Sasagawa | 356/614 |
| 6,485,149 B1 | * | 11/2002 | Berg et al. | 359/615 |
| 6,624,899 B1 | | 9/2003 | Clark | |
| 2004/0066499 A1 | | 4/2004 | Rheme et al. | |
| 2007/0091300 A1 | * | 4/2007 | Hall | 356/218 |

FOREIGN PATENT DOCUMENTS

JP 2006-134922 5/2006

* cited by examiner

*Primary Examiner*—Gregory J Toatley, Jr.
*Assistant Examiner*—Rebecca C Slomski
(74) *Attorney, Agent, or Firm*—Banner & Witcoff, Ltd.

(57) ABSTRACT

An optoelectronic distance sensor with slant component 200 having a spacer 202 bonded on a mother substrate 201 is disclosed. The spacer 202 has slant surface for receiving one or more optoelectronic components 204, such as an optical sensor, that are mounted at an angle to the mother substrate 201. Such electronic components 204 are bonded on a daughter substrate 203 which attaches to the spacer 202 at the slant surface. The optoelectronic assembly 200 can be manufactured at chip-level, including by one ore more of exemplary methods disclosed herein.

19 Claims, 11 Drawing Sheets

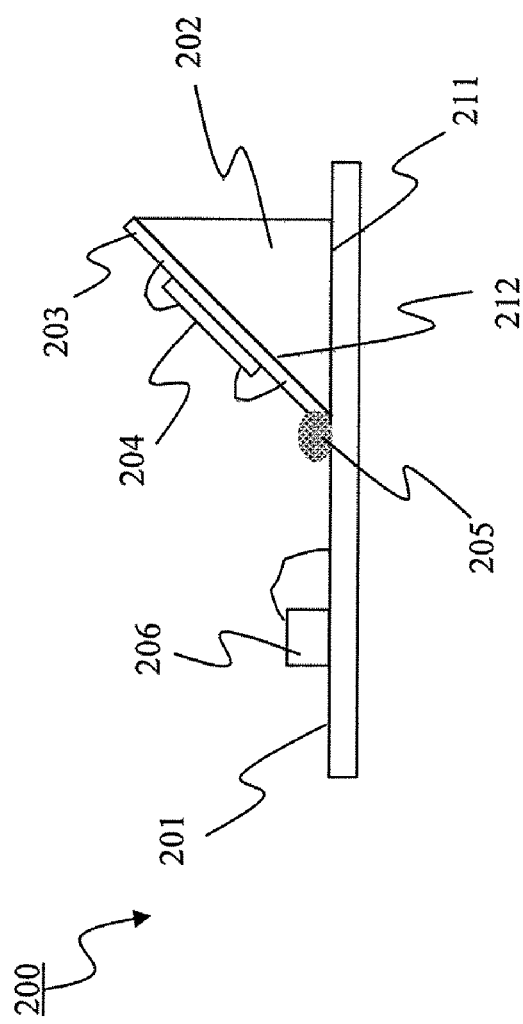
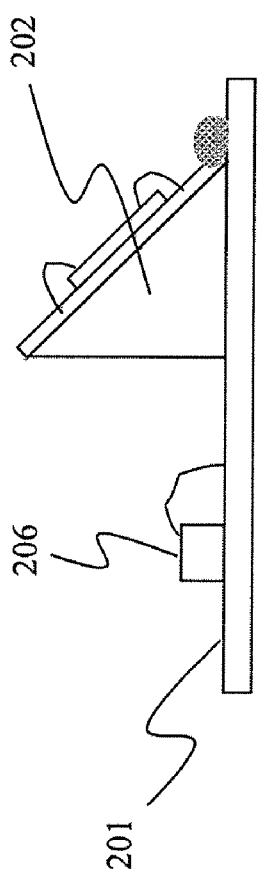
Fig. 2a
Fig. 2b

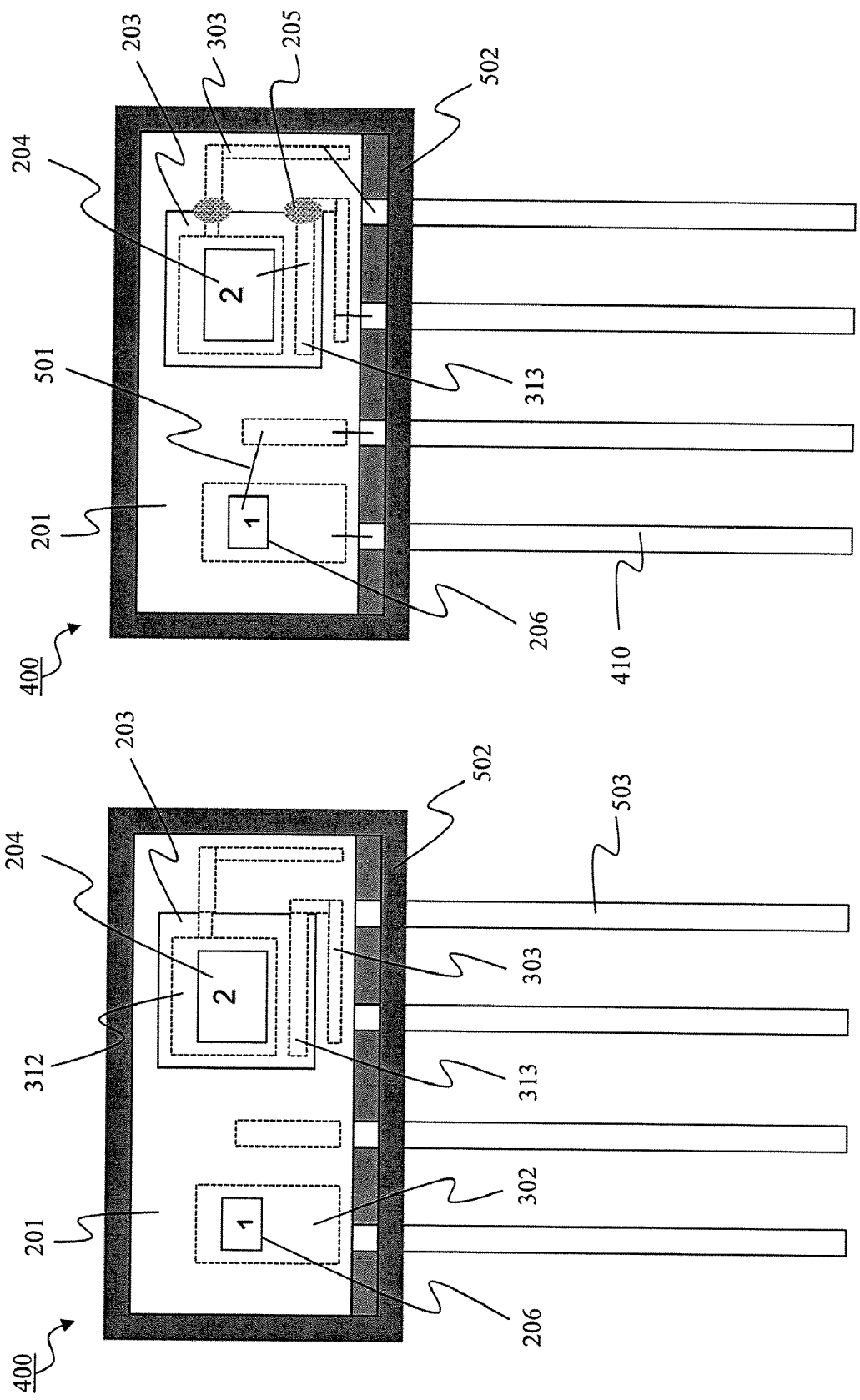

OPTOELECTRONIC DISTANCE SENSOR

TECHNICAL FIELD

The present invention relates generally to electronic assemblies with a slant optical component in the chip-level assembly. More particularly, aspects of the invention relate to electronic assemblies of distance measurement sensors and methods of manufacturing the same.

BACKGROUND

One known method for measuring a distance against a remote object is by using an optical reflective sensor based on the triangulation principle. A wide variety of applications have been derived from the method including semiconductor assembly equipment, manufacturing process control, liquid level monitoring, camera, ranger finder, and 3D profile measurement.

A conventional optical reflective sensor generally includes an optical emitter or light source for emitting an optical wave such as infrared light, an optical sensor for receiving the optical wave reflected by a remote object, and an electronic circuit for processing the wave signal from the optical sensor and may be in communication with other components in the system, such as a microprocessor or an ASIC (Application Specific Integrated Circuit). The optical emitter, optical sensor and the electronic circuit are normally packaged and manufactured into a single electronic assembly or a module.

Designs of mechanical structures for optical reflective sensor assembly have been developed to achieve higher performance. For example, the optical sensor may be oriented at a slant position angularly offset from the optical axis of the emitted light such that the optical sensor is aligned with the image plane. Accordingly, more sensitive and accurate measurement can be performed when the image on the optical sensor is in focus.

Like many other electronic devices, shrinkage in the assembly size is preferred for the distance sensor to accomplish lower materials cost and portability of the final product. In specific manufacturing industries, such as the semiconductor packaging industry, where on-line monitoring is required, there is a strong need for short-range distance sensors with high accuracy to be mounted in most assembly machines under the constraints of limiting space, and light weight to enable fast-moving of assembly machine parts. Furthermore, there is also a large quantity of applications for miniature distance sensors in consumer electronics. For example, by incorporating a range-finder consisting of miniature distance sensor in a cell-phone, a device so equipped becomes capable of switching to speaker mode from handset mode when sensing the cell-phone being away from user for a certain distance. This feature is particular advantageous for users who need to use the cell-phone often during driving.

However, known manufacturing processes for distance sensor assemblies are performed at the component level, limiting the further shrinkage of distance sensor size. This is because the assembly equipment in the packaging industry works on a planar platform with standard accessories in order to avoid the problems of wire-bonding on slant surfaces. Dedicated and hence costly equipment is required for making miniature assembly with the foregoing slant sensor arrangement, for example, below the size of about 2 mm×2 mm. As a result, the manufacturing cost for small size optical distance sensors becomes undesirably high.

U.S. Pat. No. 6,624,899 entitled "Triangulation displacement sensor" describes an optical sensor based on a triangulation method. The beam shaping elements are arranged such that the image formed on the detector element is slightly homogenized. As a result, the intensity of the image has smooth peaks and symmetrical variation.

US Patent Application Publication Number US2004/066499A1 entitled "Optical distance measuring device" discloses an optical distance detecting device having two detectors. One of the detectors is inclined at an angle between 10° and 170° with respect to the reference plane of the emitting axis in order to improve the result of measurement and to realize background suppression sensors having small dimensions.

JP Patent Application of publication number JP2006134922 entitled "Lead frame and physical value sensor using this, and further, method of packaging physical value sensor chip" discloses a lead frame structure which improves the yield of chip mounting at an inclined surface.

While the foregoing examples suggest slant arrangement of sensors, none of them provide a cost effective solution for assembling the slant structure.

Another problem for manufacturing miniature distance sensor relates to calibration. Sensing distances using small-sized photodiodes and position sensing detectors (PSD) are based on the magnitude of the photo-current generated by the light that is reflected from the objects being detected. The photo-current magnitude depends on the reflectivity of the object. Accordingly, there exists discrepancy in distance detection for objects with different reflectivity. To tackle this problem, more expensive detectors such as CCD/CMOS sensors are used to detect the actual light spot location on the sensor in order to provide high sensing accuracy and high tolerance against variation of object reflectivity. However, this approach requires complex lens structure and signal processing electronics to accomplish the whole sensing algorithm. This substantially increases the device size and the manufacturing cost. The object reflectivity issue discourages people from using the low cost and small size photodiodes and position sensing detector (PSD) for distance sensing applications. Therefore, the art would benefit greatly from cost-effective calibration methods for distance sensors using photodiodes and PSD which perform routine measurement on limited types of materials, such as for distance sensors in semiconductor packaging machines. The art would further benefit from improved optoelectronic distance sensors containing slant mounting surfaces and methods for manufacturing and calibrating the same that may be utilized in miniature assembly while keeping a low production and maintenance cost.

SUMMARY

Conventional manufacturing processes for optical distance sensors are usually carried out by component-level assembling, therefore imposing limitation on the miniaturization of the sensor assembly. Aspects of the invention solve the miniaturization problem by using chip level tooling during manufacturing of the optical distance sensor.

However, traditional chip level manufacturing tools are designed for process on planar layout. While optical sensors are usually fabricated on a planar monolithic chip, the mounting of such planar sensors on a slant surface cannot be achieved by conventional planar production tooling under known manufacturing process. For example, conventional equipment does not have the capacity to bond sensor chips on slant PCB substrates. The wire-bonding of the sensor chips on such slant surfaces is another problem. Further aspects of the invention are directed towards using conventional chip level manufacturing equipment to make miniature modules for an optical distance sensor. In certain embodiments, costs due to dedicated equipment are avoided.

Accordingly, several aspects of the invention have been developed with a view to substantially reduce or eliminate the drawbacks described hereinbefore and known to those skilled in the art and to provide an electronic assembly that may be manufactured by lower cost processes than presently employed. In certain embodiments, the electronic assembly includes a spacer which is bonded on a mother substrate. The spacer has slant surface for receiving electronic components that are required to be mounted at an angle to the mother substrate, for example, an optical sensor in embodiments comprising an optical distance sensor. Such electronic components may be bonded on a daughter substrate which attaches to the spacer at the slant surface.

Advantageously, in certain embodiments, the spacer comprises a prism with two of its surfaces at an acute angle with each other. Such a structure may be fabricated conveniently by chip level equipment by process described hereinafter according to still yet further aspects of the invention. Nonetheless, those skilled in art with the aid of this disclosure, may readily understand that other methods may be employed to fabricate such a spacer without departing from the scope of the invention. The spacer may comprise insulating materials such as silicon, ceramic or glass, or combinations thereof. In certain embodiments, the spacer may be sawed by a die-sawing machine.

The optical sensor may be chosen from a multitude of sensors known to those skilled in the art with the benefit of this disclosure and may include a photodiodes, a position sensing detector (PSD), a photodiode array, a complementary metal-oxide-semiconductor (CMOS) sensor, or a charge-coupled devices (CCD).

Other electronic components may also be in communication with, such as bonded on, the mother substrate. The optical distance sensor may be, chosen from a multitude of sensors known to those skilled in the art with the benefit of this disclosure and may include one or more of the exemplary components including a light emitting device, such as an infrared light emitting diode (LED), a visible light LED or a laser diode.

According to another aspect of the present invention, there is provided a method of assembling one or more of the foregoing electronic modules or variations thereof at the chip-level, including methods that comprise: fabricating a prism shaped spacer with two of its surfaces formed at an acute angle, adhering or bonding electronic components such as the optical sensor on a daughter substrate, wire-bonding such optical sensors to circuits on the daughter substrate, adhering or bonding the daughter substrate on the slant surface of the spacer, adhering or bonding the spacer to a mother substrate, connecting electrically the respective circuit on the mother substrate and the daughter substrate by soldering; adhering or bonding other electronic component such as light source on the mother substrate, and wire bonding the light source to circuits on the mother substrate. Those skilled in the art will readily appreciate that one or more of the above components of the method may be modified, omitted or otherwise altered without departing from the scope of the invention.

For example, in an exemplary embodiment, an exemplary method the fabrication of the spacer may include the process of die-sawing a thin plate of silicon (such as a typical silicon wafer), ceramic or glass with a dicing blade at a plurality of angles. In one embodiment, the silicone may be die-sawed at two different angles. As another exemplary example, one or more of the substrates and/or electronic components may utilize one or more die bond adhesives for adhesion. Further, in yet another exemplary embodiment, soldering may comprise solder paste dispensing or solder reflowing.

According to a further aspect of the present invention, a method of characterizing the optical distance sensor, which may include the measuring of signals of an optical distance sensor against at least two reference surfaces to obtain measurement results, wherein the respective measurement result corresponding to each reference surface contains at least two measurements made by placing the reference surface at different calibrating distances from the sensor; plotting curves of the measurement results against the distance for each respective surfaces, obtaining an intersection of curves for the respective surfaces, measuring signal against a test surface separated from the sensor by a predetermined distance, plotting the measurement result corresponding to the test surface; and joining the test point with the intersection of curves to obtain calibration curve of the test surface.

Advantageously, at least one of the reference surfaces has reflectivity higher than the test surface, and at least one of the reference surfaces has reflectivity lower than the test surface. The reference surfaces may be selected from ceramic, 90 Kodak, 18 Kodak, bulk paper, and bulk resin.

The measuring signals of the optical sensor against at least two reference surfaces further includes making at least two measurements such that at least one of the calibrating distances is substantively close to the upper end of the working distance of the sensor; and at least one of the calibrating distances is substantively close to the lower end of the working distance of the sensor.

The presently claimed invention may characterize an optical sensor including at least two photodiodes. The measurement results obtained from measuring signals of the optical sensor against various reference surfaces may correspond to the difference of the signals output by the two photodiodes. In an exemplary embodiment, the measurement result may be represented by $$\frac{\text{Current output by a first photodiode} - \text{Current output by a second photodiode}}{\text{Current output by a first photodiode} + \text{Current output by a second photodiode}}.$$

As another exemplary embodiment, during the characterization of an optical sensor including at least two photodiodes, the intersection of curves for the respective one or more surfaces occurs when current output by the two photodiodes are substantively the same.

Preferably, the calibration curve describes the relationship between the signal strength of the optical sensor and the distance that the optical sensor separates from the test surface.

Through improved assembly structures and corresponding manufacturing and calibration processes, such as described in the foregoing exemplary embodiment, limitation on the miniaturization of the assembly on tilted structure can be overcome whereas such miniature assembly may be produced by semiconductor manufacturing equipment with low production. Disclosed calibration methods also provides options for certain optical distance sensors using simple detector units (i.e., photodiodes or PSD) to reduce or eliminate object reflectivity. Thus, in select usages, a low-cost solution for routine semiconductor inspection on various types of materials (i.e., die surface, lead frame surface, or PCB surface) may be achieved.

Other aspects of the invention are also disclosed.

BRIEF DESCRIPTION OF DRAWINGS

Embodiments of the invention are described in more detail hereinafter with reference to the drawings, in which:

FIG. 2a shows an exemplary core structure that may be utilized for accommodating an optical sensor at a slant orientation relative to a light source component in accordance with an embodiment of the present invention;

FIG. 2b shows an exemplary core structure that may be utilized for accommodating an optical sensor at a slant orientation relative to a light source component in accordance with another embodiment of the present invention;

FIG. 4b shows the top view of the module in FIG. 4a before electrical connection according to an embodiment of the invention;

FIG. 4c shows the top view of the module in FIG. 4a after electrical connection according to an embodiment of the invention;

DETAILED DESCRIPTION

Improved assembly structures for optical distance sensors and corresponding manufacturing and calibration process are disclosed herein. In the following description, numerous specific details, including component size, distance, currents, and the like are set forth. However, from this disclosure, it will be apparent to those skilled in the art that modifications, including additions and/or substitutions may be made without departing from the scope and spirit of the invention. In other circumstances, specific details may be omitted so as not to obscure the invention. Nonetheless, the disclosure is written as to enable one skilled in the art to practice the teachings of the embodiments of the invention without undo experimentation.

Figure 1:
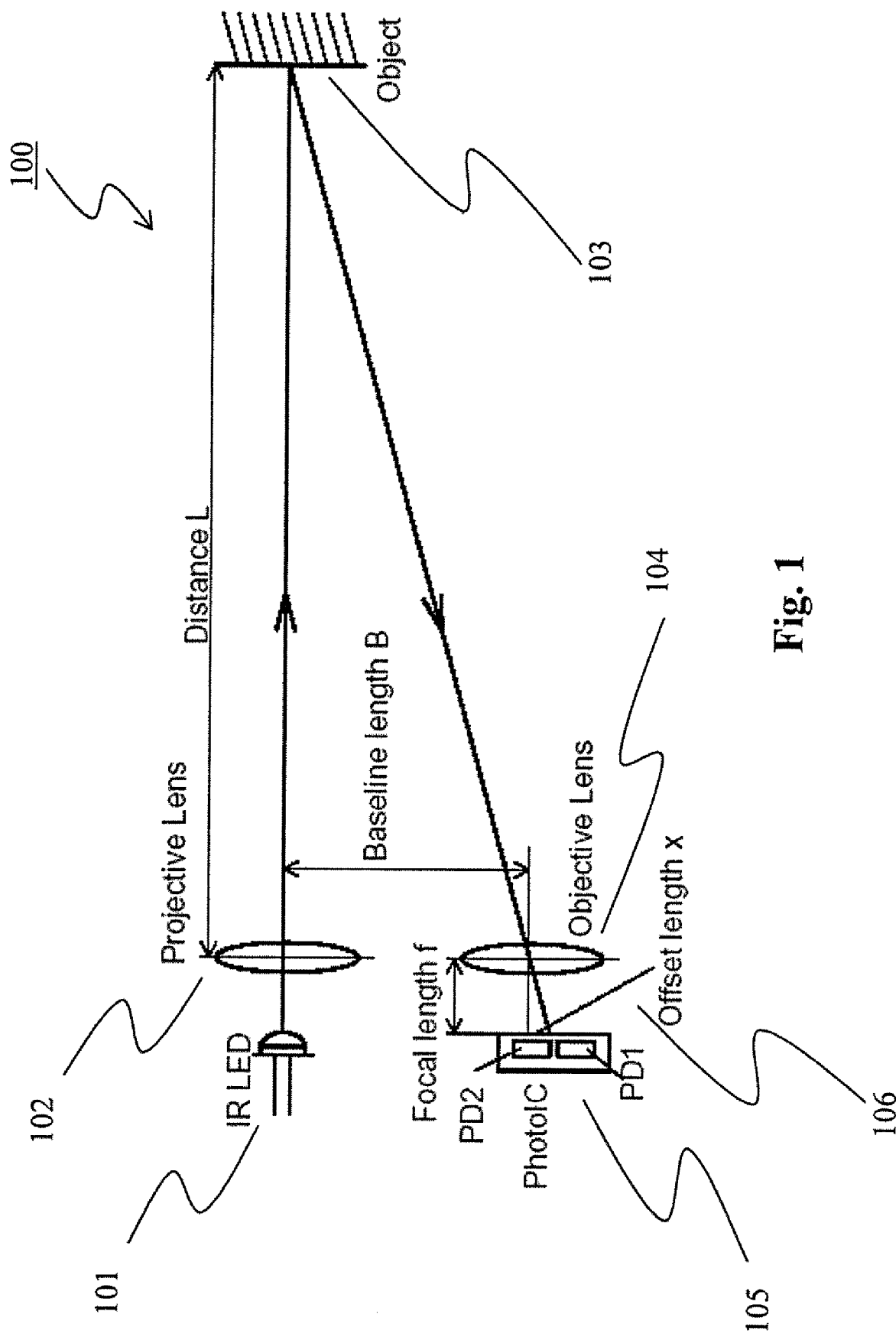
FIG. 1 shows an exemplary optical distance sensor measuring the distance against a remote object by the triangulation principle.

FIG. 1 shows exemplary optical distance sensor 100 measuring the distance against a remote object by the triangulation principle. The light source component 101, emits optical wave through projective lens 102 to a remote object 103 at a distance L from the distance sensor 100. In the illustrated embodiment, the light emitting component 101 comprises an infrared LED, however, those skilled in the art will readily appreciate that other light source components may be utilized, wherein the selection of the light source component will depend on a myriad of factors, including but not limited to, the use for the light source, desired characteristics of the light source, costs, size, manufacturing, and the like. Optical wave reflected by the remote object 103 are received by an optical sensor 105, such as, for example, IC containing photodiodes, via the objective lens 104. As seen in the FIG. 1, the objective lens 104 is separated from the projective lens 102 by a baseline length, B. In the exemplary illustration, the optical sensor 105 is disposed behind the objective lens 104 by a separation equal to the focal length, ("f") of the objective lens 104. As such, the reflected optical wave forms an image on the optical sensor 105.

In use, the image is formed at a position on the optical sensor 105 depending on the distance ("L") from the remote object 103. The image offsets from the optical axis of the objective lens 104 by a distance of ("x") such that:

$$L = B * f / x \qquad \text{Equation 1}$$

Accordingly, the image offsets further away from the optical axis as the remote object 103 gets closer to the distant sensor 100.

When the object distance ("L") is shortened, the image distance decreases and the image moves towards the objective lens 104. According to an embodiment of the invention, the image plane 106 may be tilted such that the image position corresponding to a nearer object is closer to the objective lens 104. In order to receive a focused and sharp image, the optical sensor 105 may be aligned with the image plane 106.

FIG. 2a shows an exemplary core structure (electronic assembly) for accommodating an optical sensor at a slant orientation relative to the light source component in accordance with an embodiment of the present invention. The core structure 200 includes a mother substrate 201, a spacer 202 with a base surface 211 and a slant surface 212, wherein the base surface 211 and slant surface are oriented at an acute angle with each other, a daughter substrate 203, and an electronic component that is accommodated at a slant surface relative to the mother substrate, for example, the optical sensor 204. In one embodiment, the optical sensor comprises a planar monolithic chip with optoelectronic elements fabricated thereon, such as photodiodes, phototransistors, PSD, CMOS sensor, CCD sensor, or equivalents thereof. The mother substrate may further contain other electronic components 206 such as the light source for an optical distant sensor.

The mother substrate 201 provides a reference plane, on which the base surface 211 of the spacer 202 attaches. Hence, the slant surface 212 of the spacer 202 is also at an acute angle relative to the reference plane of the mother substrate 201. The daughter substrate 203 is in rigid communication to, such being adhered to the slant surface 212 of the spacer 202. Appropriate adhesives are well-known in the art. Additionally, the electronic component 204 is rigidly attached on the daughter substrate 203. In further embodiments, electrically conductive pathways may further be fabricated on the mother substrate 201 and the daughter substrate 203. Through connecting, such as by, wire bonding the electronic component 204 to the daughter substrate 203 conductive pathways and further dispensing solder 205 linking the conductive pathways at the border between the mother substrate 201 and daughter substrate 203, electrical signals generated from the electronic component 204 can be transmitted to other components 206, such as light sources, on the mother substrate 201. The spacer 202 is attached to the mother substrate 201 in such a way that the slant surface 212 faces substantially towards the components 206.

It will be understood by those skilled in the art with the benefit of this disclosure that the electronic components 204, 206 in the core structure 200 shown in FIG. 2a are not limited to optical sensors or light sources but can also extend to any components that are required to be oriented at an angle to the reference plane of the mother substrate 201.

FIG. 2b shows an exemplary core structure (electronic assembly) configured to accommodate an optical sensor at a slant orientation relative to the light source component in accordance with another embodiment of the present invention. Such an embodiment differs from the exemplary structure described in FIG. 2a by the orientation of the spacer 202, wherein the slant surface faces towards the components 206 on the mother substrate 201.

Figure 3A:
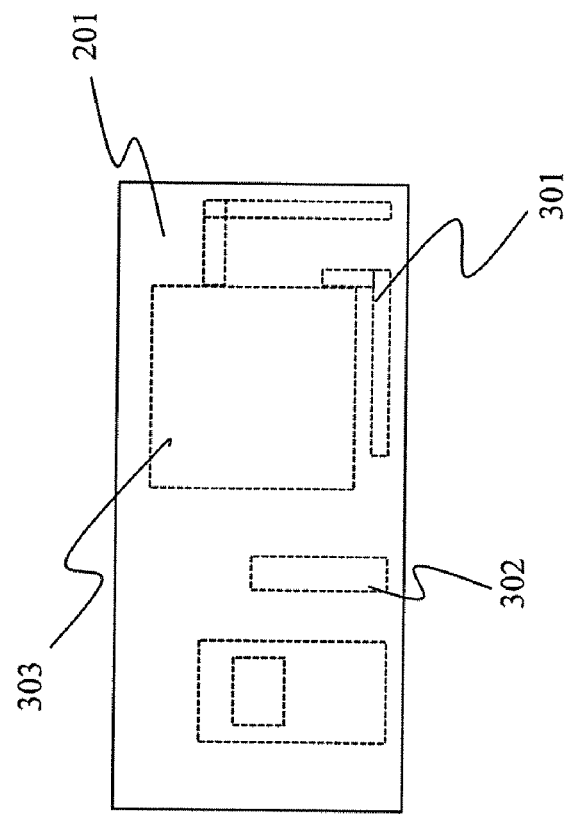
FIG. 3a shows an exemplary layout of conductive pathways on a mother substrate according to an embodiment of the present invention.

FIG. 3a shows the layout of optional exemplary conductive pathways 301 on the mother substrate 201 according to an embodiment of the present invention. The conductive pathways may be conductor, such as copper, that is commonly used in the manufacture of printed circuit boards. The pathways 301 may be in the form of pads 302 for bonding components thereon or traces 303 for electrically connecting components. The mother substrate 201 may be made of insulating materials such as, for example, plastic. The conductive pathways 301 may be laminated with the mother substrate by adhesive materials such as epoxy resin.

Figure 3B:
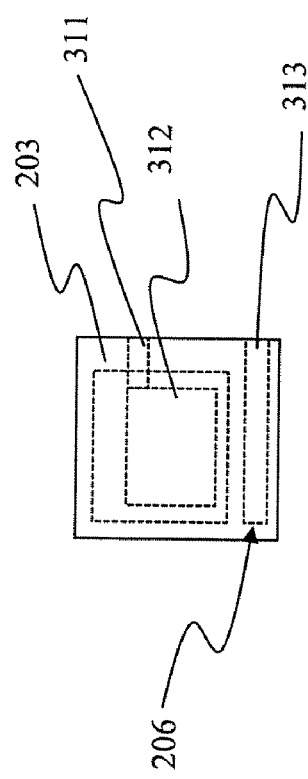
FIG. 3b shows an exemplary layout of conductive pathways on a daughter substrate according to an embodiment of the present invention.

FIG. 3b shows an exemplary layout of conductive pathways 311 on the daughter substrate according to an embodiment of the present invention. Similar to the layout in FIG. 3a, the conductive pathways 311 may be conductors, such as copper, as generally used in printed circuit boards. The pathways 311 may be in the form of pads 312 for bonding components thereon or traces 313 for electrically connecting components. The daughter substrate 203 may be made of insulating materials such as plastics or ceramics. The conductive pathways 311 may be laminated with the daughter substrate by adhesive materials such as, for example, epoxy resin.

Figure 4A:
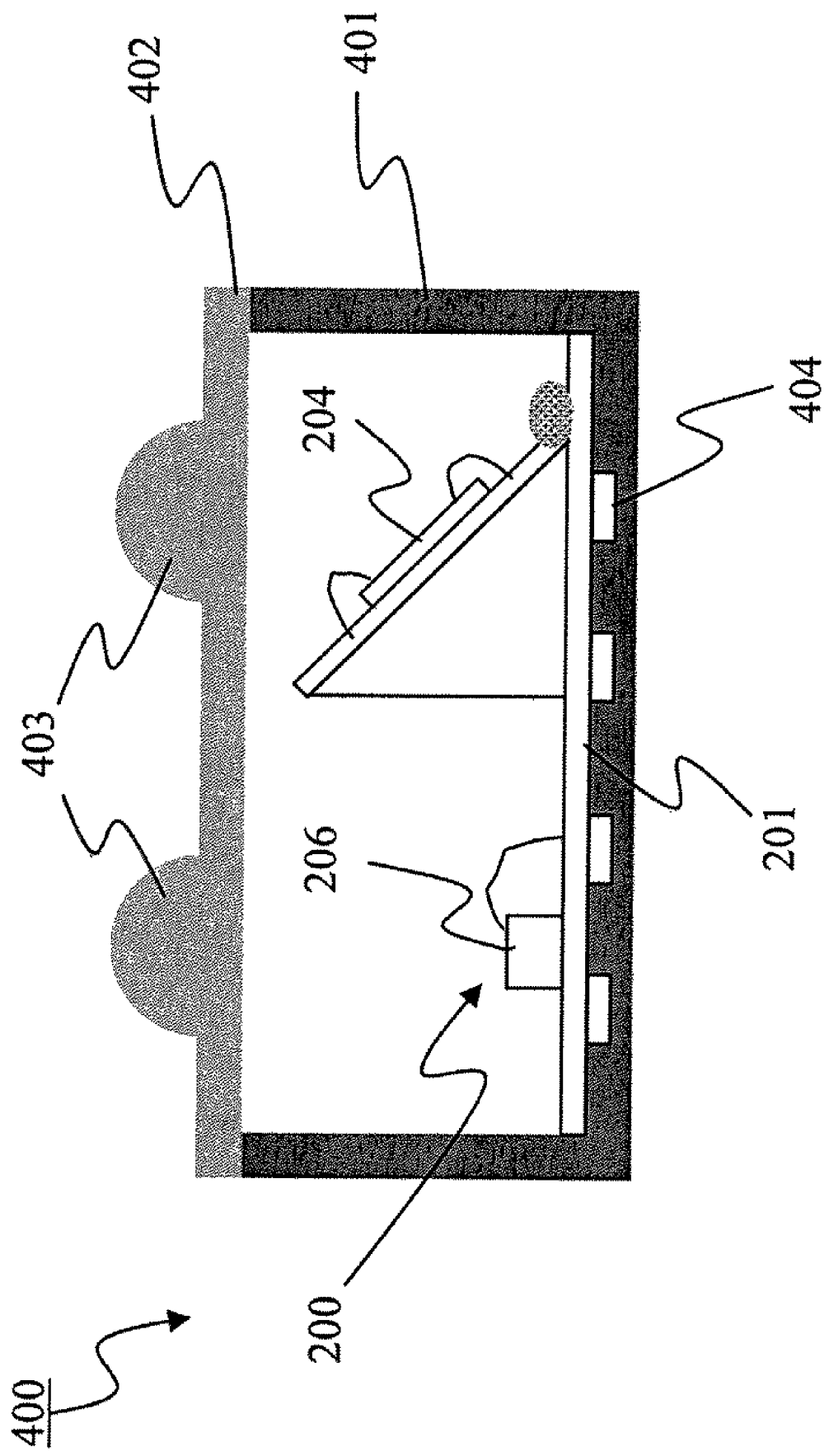
FIG. 4a shows a sectional view of an exemplary core structure, such as presented in FIG. 2a or FIG. 2b, being packaged into a module according to an embodiment of the invention.

FIG. 4a shows the sectional view of the exemplary core structure in FIG. 2a and alternately FIG. 2b being packaged into a module 400 according to an embodiment of the invention. Exemplary core structure 200 is accommodated in an encapsulation 401. A lens cap 402 with transparent convex portions 403 may be utilized to cover the encapsulation 402 to seal the core structure 200. The convex portions 403 may be located on the lens cap at positions such that they work as projective lens and objective lens for the light source 206 and optical sensor 204, respectively. The module 400 may further comprise lead pins 404 that electrically couple the module 400 to the conductive pathways (not shown) on the mother substrate 201 and may further extend outside the encapsulation 401 for connecting with external circuits (not shown).

FIG. 4b shows the top view of the exemplary module 400 of FIG. 4a before electrical connection, without showing the lens cap. In an exemplary embodiment, the optical sensor 204 may be bonded, or otherwise rigidly connected to the conductive pad 312 on the slant surface of the daughter substrate 203. The daughter substrate 203 may further be bonded or otherwise rigidly connected to the mother substrate 201 such that the conductive traces 303, 313 on the respective substrates 201, 203 align with each other at the border where the slant surface of the daughter substrate 203 meets the mother substrate 201. In addition, the light source 206 is bonded or otherwise attached on the mother substrate 201 at the conductive pad 302.

FIG. 4c shows the top view of exemplary module 400 of FIG. 4a after electrical connection, without showing the lens cap. In an exemplary embodiment, the optical sensor 204 and light source 206 are wire-bonded to respective conductive traces 303, 313 on the daughter substrate 201 and mother substrate 203. The aligned conductive traces 303, 313 at the border between daughter substrate 203 and mother substrate 201 may be connected, such as by dispensing solder 205. The conductive traces 303 on the mother substrate 201 are further connected by wire bond 501 to lead pins 404 in a pre-molded lead frame 410.

FIGS. 5a to 5e illustrate an exemplary method of manufacturing the core structure described in relation to FIGS. 2a and 2b according to an embodiment of the invention.

Figure 5A:
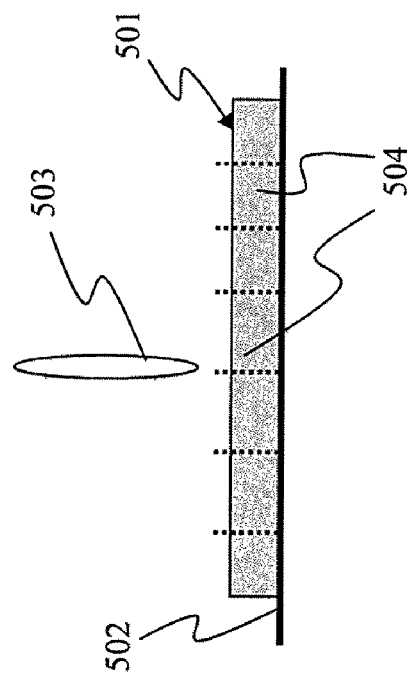
FIG. 5a to 5f illustrate an exemplary process for manufacturing the core structure described in FIG. 2a and 2b according to an embodiment of the invention.

FIG. 5a illustrates an exemplary method of die sawing. A thin plane of substrate 501 made of insulating material, such as for example, silicon is initially placed on a substantially horizontal plane. A dicing blade 503 may be applied in a substantially vertical orientation to cut the substrate 501 into blocks 504. The substrate blocks 504 are held together at the bottom surface, for example, by a dicing tape 502.

Figure 5B:
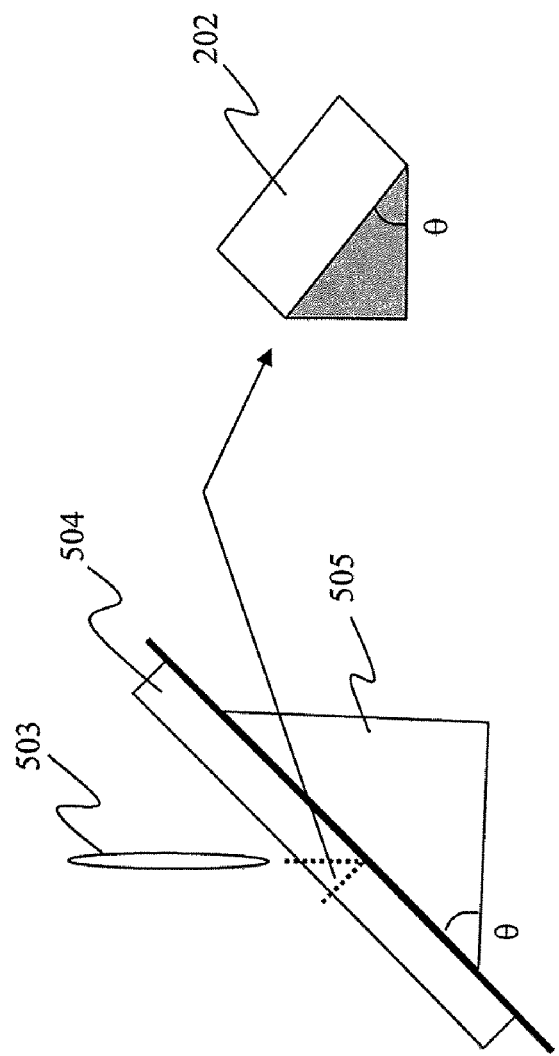

FIG. 5b illustrates an exemplary method of die sawing a slant surface. The substrate blocks obtained from the exemplary method shown in FIG. 5a may be placed on a slant dicing holder 505. The slant dicing holder 505 has a slant surface at an acute angle θ to the horizontal plane. The dicing blade 503 may again be applied in a substantially vertical orientation to the substrate blocks 504 such that a slant surface is created on the substrate blocks 504. In an exemplary embodiment, a triangular prism is obtained from the substrate block 504 which becomes the spacer 202 with an angle θ between two of its planes.

Figure 5C:
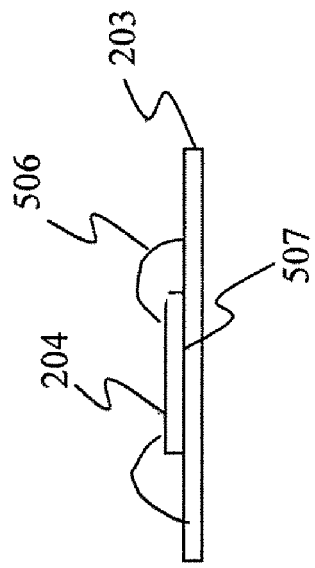

FIG. 5c illustrates an exemplary method die attach. The optical sensor 204, such as in the form of a monolithic chip, may be attached to the daughter substrate 203 by die bond adhesive 507. The pads on the optical sensor may further be connected to conductive traces of the daughter substrate 203, for example, by wire bond 506.

Figure 5D:
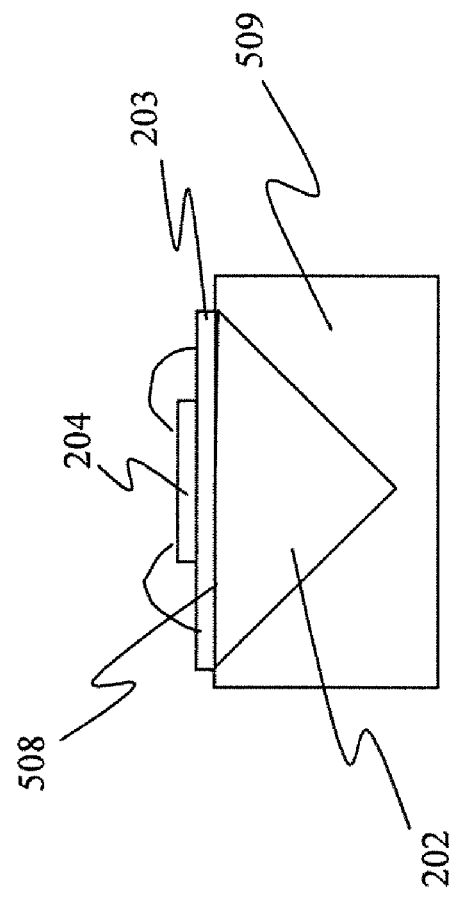

FIG. 5d illustrates an exemplary method of attaching the daughter substrate. A slant-surface spacer 202, for example the spacer obtained by following the methods described in relation to FIG. 5b above, may be held by a die bond holder with V-groove 509. The V-groove 509 comprises a cavity generally complementary to the shape of the slant-surface spacer 202 such that when the spacer 202 is placed in the V-groove 509, the slant surface faces upward and becomes substantially horizontal. The daughter substrate 203 with optical sensor 204 obtained from the exemplary method in FIG. 5c may be translocated to the slant surface of the spacer 202 by, for example, an indented die bond collet 51. The daughter substrate may then be attached to the spacer 202 by die bond adhesive 508.

Figure 5E:
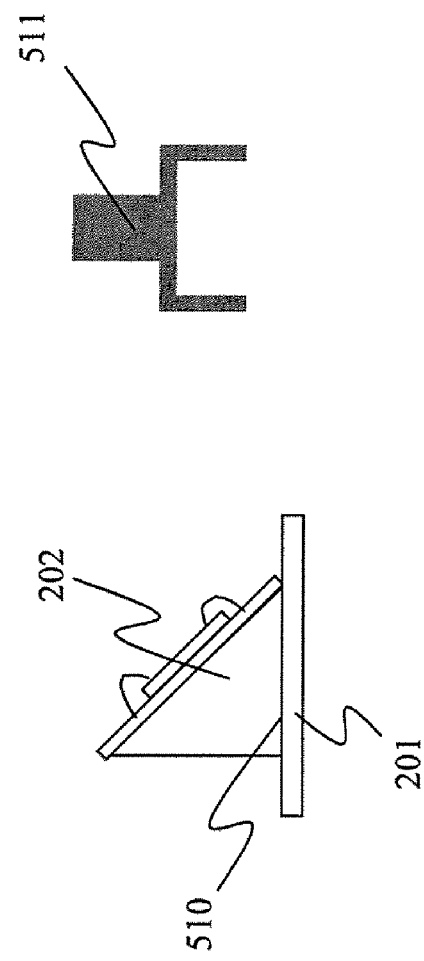
Figure 5F:
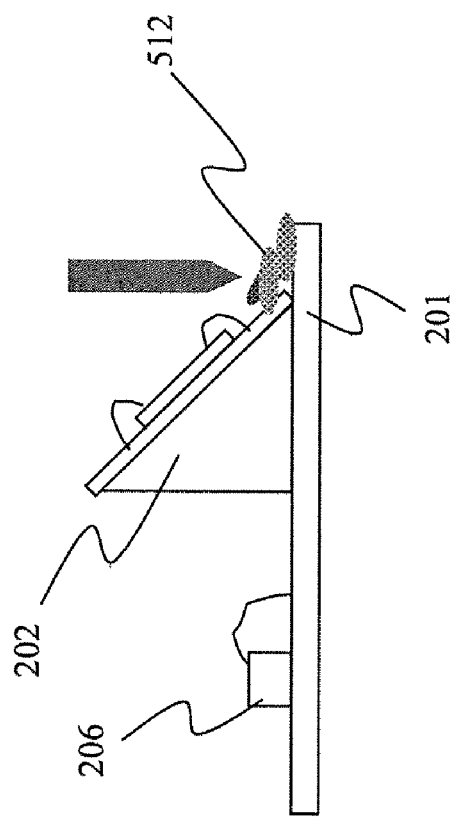

FIG. 5e illustrates an exemplary method of attaching the spacer. The spacer 202 may be removed from the die bond holder and adhered or otherwise rigidly connected to the mother substrate 201 by die bond adhesive 510. As provided in FIG. 5f, the conductive traces on the daughter substrate may be electrically connected to the conductive traces on the mother substrate 201 solder 512 created by solder paste dispensing or solder reflowing. Other components such as the light source 206 may also be attached to the mother substrate 201 by die bond adhesive 510 and wire-bonded to the conductive traces on the mother substrate.

Figure 6:
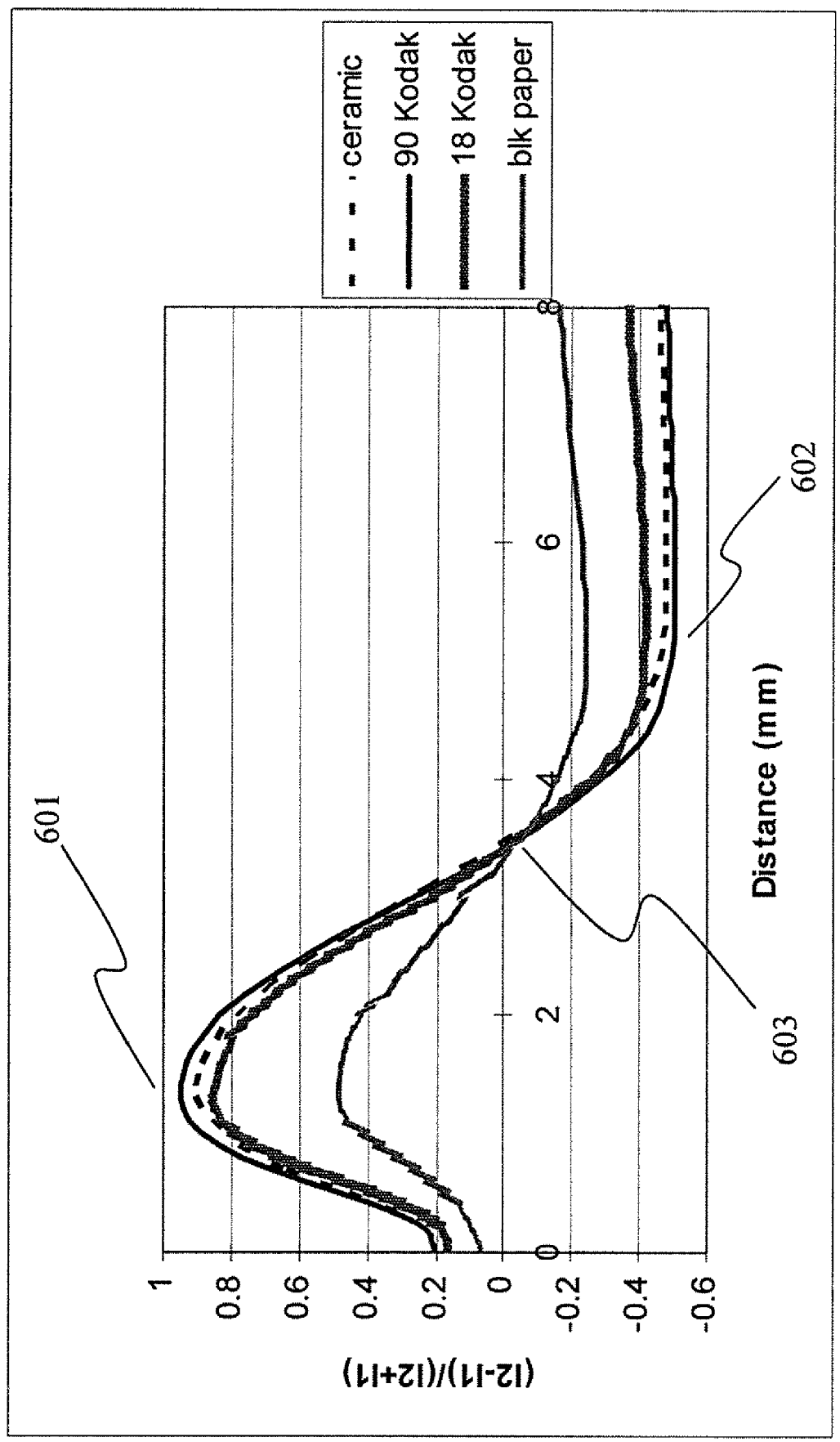
FIG. 6 shows an exemplary working diagram for an optical distance sensor with dual photodiodes which may be used in accordance with one embodiment of the invention.

After the manufacturing of a distance optical sensor, it is often required to characterize the device and describe the measured characteristics in the product specification for the reference of the users. Particularly, a working diagram is often provided reflecting the relationship between the sensor current and object distance. An example of such a working diagram for an optical distance sensor with dual photodiodes is shown in FIG. 6. The X-axis of the plot is the distance between the sensor and the tested object. The Y-axis of the plot represents the factor $$\frac{I_2 - I_1}{I_2 + I_1} \qquad \text{Equation 2}$$

where ("I1") and ("I2") are the respective current output by the two photodiodes in the sensor.

Various curves may be plotted for one or more tested objects with different test surfaces, which may include, for example: ceramic, bulk paper, bulk resin. The inventors have also discovered that 90 Kodak and/or 18 Kodak commercially available from Kodak, Rochester, N.Y., U.S.A. provided satisfactory test surfaces.

Notwithstanding different reflectivity properties of the test surfaces, there is a general trend exhibited by the curves. For example, in the exemplary plot shown in FIG. 6, the curves rise initially at the starting distance of 0 mm from a value around zero and approach peak values 601 at a distance between 1 mm and 2 mm. Thereafter, the curves fall in a substantially linear manner to negative values and eventually reach steady values 602 at a distance between 4 mm and 5 mm. Accordingly, the optical distance sensor is operable to measure distance in the linear region, i.e.: between peak values 601 and steady values 602.

It can further be observed that all the curves substantially intercept at a common crossing point 603 (or intersection). The common crossing point reflects the situation where I1=I2, and happens when the light spot formed by the reflected light from the object falls at the center of the PSD or between the two photodiodes. Different calibration lines are obtained for objects having different reflectivity. This may be caused by a multitude of reasons, including: (1) different scattering patterns, hence affecting the ratio of I1:I2; and/or (2) dead zone in photodiodes, which is the gap between photodiodes. Nevertheless, the point where the curves intercept the x-axis is substantially the same irrespective of the variation of object reflectivity. A calibration scheme may be developed to characterize optical distance sensors based on this phenomenon.

Figure 7:
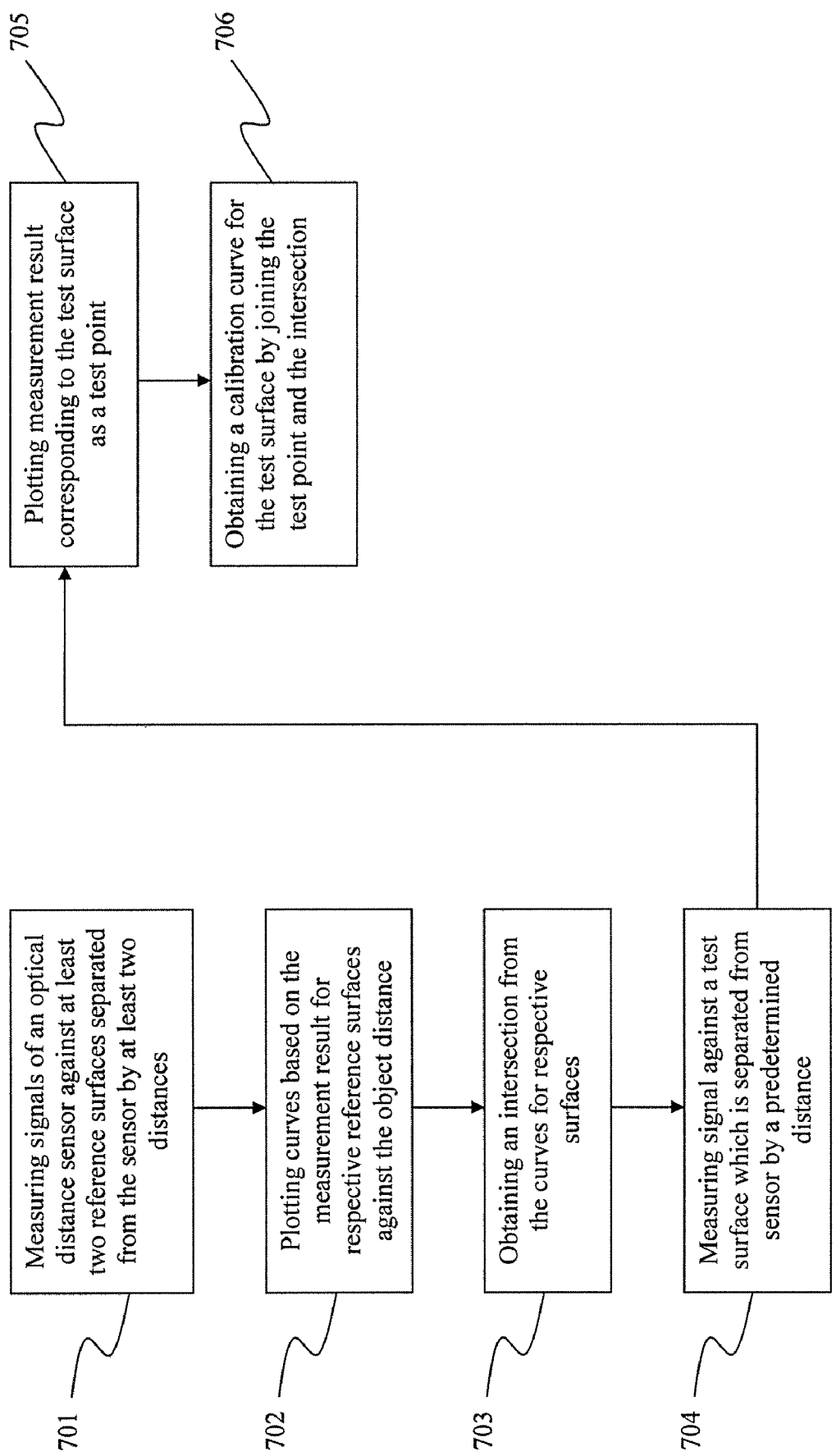
FIG. 7 is a flow diagram for an exemplary method for characterizing optical distance sensors according to an embodiment of the present invention.

FIG. 7 shows a flow diagram of an exemplary method for characterizing optical distance sensors according to an embodiment of the present invention. At step 701, signals of an optical distance sensor are measured against at least two reference surfaces, wherein the respective measurement result corresponding to each reference surface contains at least two measurements made by placing the reference surface at different calibrating distances from the sensor. Hence, at least four measured values may be obtained. Measurement of the signals may be made on the electrical characteristics such as current or voltage of the signals. The reference surfaces can be any surfaces with different reflectivity, preferably reference surfaces complying industrial standard such as the Kodak standard, known to those in the art, to provide reliable reference. In one exemplary embodiment, at least one of the reference surfaces has reflectivity higher than the test surface, while at least one of the reference surfaces has reflectivity lower than the test surface such that the measurement error has less effect on the calibration. Furthermore, the test distances should be chosen within the operating range (or working distance) of the distance sensor, and preferably around the upper end and the lower end of the operating range of the sensor to reduce the effect of measurement error and to enhance the reliability of the characterization.

At step 702, curves are plotted against the object distance based on the measurement result in step 701 for respective reference surfaces. In an exemplary embodiment, the measurement results are expressed as $$\frac{I_2 - I_1}{I_2 + I_1} \qquad \text{Equation 3}$$

where ("I1") and ("I2") are the respective current output by the two photodiodes or PSD in the distance sensor. Accordingly, at least two curves are obtained in the plot, each corresponding to the respective reference surface.

At step 703, an intersection is obtained from the curves in step 702 for respective surfaces. According to the foregoing description, the intersection is a common crossing point through which the curves from different surfaces intercept. The coordinates of the intersection may be recorded and published in the product specification.

At step 704, the user may calibrate equipment which utilizes the distance sensor. A signal is measured against a test surface in which the test surface is separated from sensor by a predetermined distance within the operating range of the distance sensor. The test surface may be the same material as the item to be detected by the distance sensor in actual use to ensure accuracy. Advantageously, only one measurement may be required to be performed according to the exemplary calibration scheme of the present invention. According to an embodiment of the invention, the measurement may be made by placing a spacer with a known height between the distance sensor and the test surface. Such a spacer can be provided by the distance sensor manufacturer.

At step 705, a measurement result corresponding to the test surface in step 704 is plotted as a test point. In an exemplary embodiment of the invention, the measurement result is expressed as $$\frac{I_2 - I_1}{I_2 + I_1}$$

and plotted against the predetermined distance in step 704.

At step 706, the intersection, for example, as obtained in step 703 is also plotted and a calibration curve for the test surface may be obtained by joining the test point and the intersection with a straight line. In one exemplary embodiment, the calibration curve describes the relationship between the signal strength of the optical sensor and the distance that the optical sensor separates from the test surface. In a further exemplary embodiment, the calibration curve can be stored as look-up table in the system that incorporates the distance sensor, such that the system can estimate the measured distance from the look-up table based on sensor signal strength.

Figure 8:
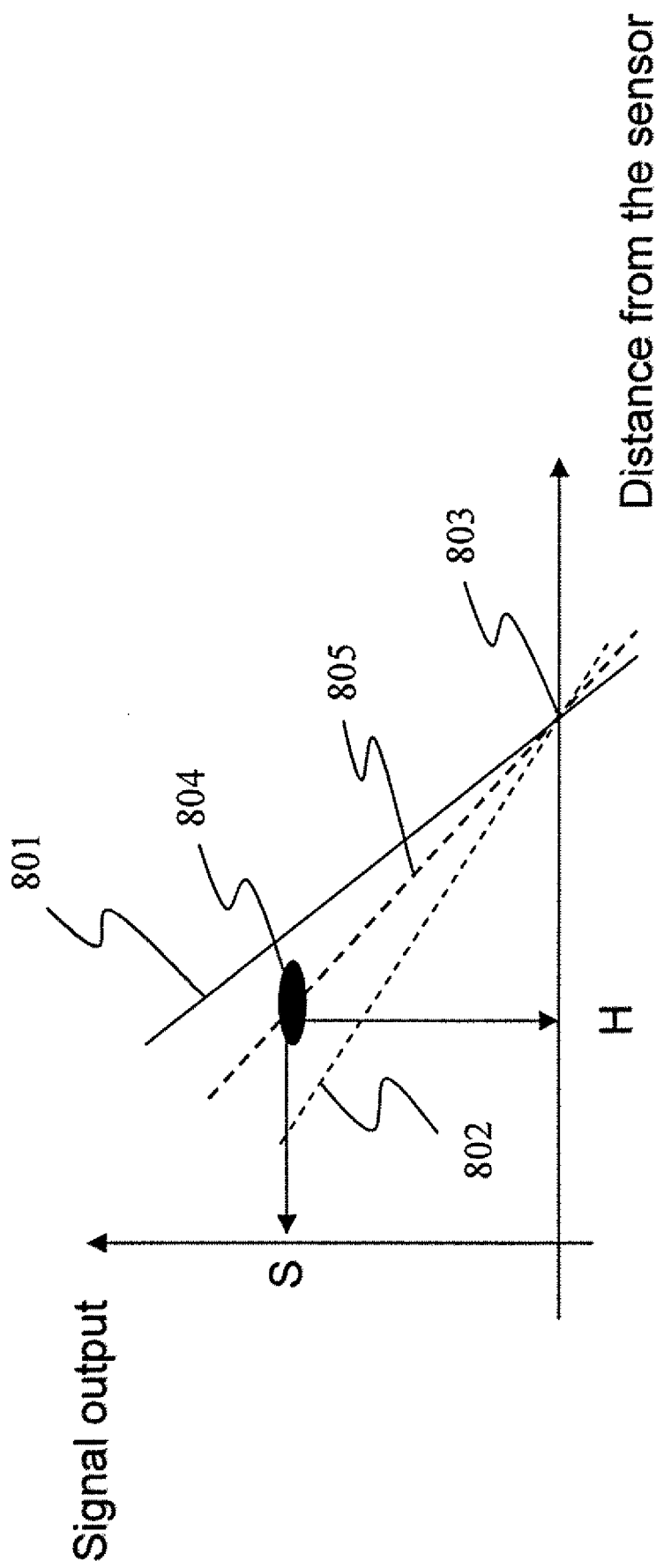
FIG. 8 shows the plot described in the characterization process of FIG. 7, which may be implemented according to one embodiment of the invention.

FIG. 8 shows an exemplary plot, described in the characterization process of FIG. 7. Curves 801 and 802 are the characteristic curves corresponding to two reference surfaces which further intercept at the common crossing point 803. Test point 804 is obtained by measuring the test surface as described in step 704, where H is the known height of the spacer separating the distance sensor and test surface. Finally, by joining the common crossing point 803 and test point 804 with a straight line, the calibration curve 805 for the test surface can be obtained.

The foregoing description of embodiments of the present invention are not exhaustive and any update or modifications to them are obvious to those skilled in the art, and therefore reference is made to the appending claims for determining the scope of the present invention.

We claim:

1. An optoelectronic distance sensor comprising:
   a spacer with a first surface and a second surface, wherein said spacer comprises a prism and wherein said first surface of the spacer is at an acute angle relative to said second surface of the spacer;
   a first planar substrate bonded to said spacer on said first surface;
   a second planar substrate bonded to said spacer on said second surface;
   a first optoelectronic device having an optical axis mounted on said first substrate; and
   a second optoelectronic device having an optical axis on said second substrate, wherein said optical axis of said first optoelectronics device is angularly offset from the optical axis of said second optoelectronics device; and
   at least one of the optoelectronics devices is a light source.

2. The optoelectronic distance sensor according to claim 1, wherein said spacer comprises insulating materials selected from the group consisting of: silicon, ceramic, glass, and combinations thereof.

3. The optoelectronic distance sensor according to claim 1, wherein said first optoelectronics device is an optical sensor selected from the group consisting of: a photodiode, a position sensing detector (PSD), a photodiode array, a complementary metal-oxide-semiconductor (CMOS) sensor, and a charge-coupled device (CCD).

4. The optoelectronic distance sensor according to claim 1, wherein said second optoelectronics device is a light emitting device selected from the group consisting of: an infrared light emitting diode (LED), and a visible light LED and laser diode.

5. The optoelectronic distance sensor according to claim 1, wherein said first substrate has a planar area less than about 2 mm×2 mm.

6. A method of assembling an optoelectronic module at chip-level, comprising the method of:
   providing a prism shaped spacer with a first surface and a second surface inclined with each other at an acute angle;
   adhering at least a first electronic component on a first substrate;
   wire-bonding said first electronic component to one or more circuits on said first substrate;
   attaching said first planar substrate to said spacer at said first surface;
   affixing said second surface of said spacer to a second planar substrate;
   connecting electrically the one or more circuits on said first substrate and said second substrate by soldering;
   mounting at least a second electronic component on said first substrate; and
   linking by wire bond said second electronic component to the one or more circuits on said first substrate wherein at least one of the electronic components is a light source.

7. The method of assembling an optoelectronic module according to claim 6, wherein fabricating the spacer comprises die-sawing a plate of silicon, ceramic or glass with a dicing blade at a first angle and a second angle.

8. The method of assembling an optoelectronic module according to claim 6, wherein the adhering, attaching, affixing and mounting of substrates or electronic components comprises the utilization of a die bond adhesive.

9. The method of assembling an optoelectronic module according to claim 6, wherein adhering the first electronic component comprises adhering an optical sensor selected from the group consisting of: a photodiode, a photodiode array, a position sensing detector (PSD), a complementary metal-oxide-semiconductor (CMOS) sensor, and a charge-coupled device (CCD).

10. The method of assembling an optoelectronic module according to claim 6, wherein mounting the second electronic component comprises mounting a light emitting device selected from the group consisting of an infrared light emitting diode (LED), a visible light LED, and a laser diode.

11. The method of assembling an optoelectronic module according to claim 6, wherein soldering comprises solder paste dispensing and solder reflowing.

12. The method of assembling an optoelectronic module according to claim 10, further comprising a characterization, including:
   measuring signals of said optical sensor against at least two reference surfaces to obtain measurement results, wherein the respective measurement result corresponding to each reference surface contains at least two measurements made by placing the reference surface at different calibrating distances from the sensor;
   plotting curves of the measurement results against the calibrating distance for the respective one or more surfaces;
   obtaining an intersection of curves for the respective one or more surfaces;
   determining a signal strength against a test surface separated from said optical sensor by a predetermined distance;
   marking said signal strength corresponding to the test surface as a test point; and
   joining said test point with said intersection of curves to obtain a calibration curve of said test surface.

13. The method of assembling an optoelectronic module according to claim 12, wherein at least one of said reference surfaces has reflectivity higher than said test surface, and at least one of said reference surfaces has reflectivity lower than said test surface.

14. The method of assembling an optoelectronic module according to claim 12, wherein said reference surfaces are selected from the group consisting of: ceramic, 90 Kodak, 18 Kodak, bulk paper, and bulk resin.

15. The method of assembling an optoelectronic module according to claim 12, wherein said measuring signals of said optical sensor against at least two reference surfaces further comprising making at least two measurements such that at least one of said calibrating distances is substantively close to the upper end of the working distance of the sensor; and at least one of said calibrating distances is substantively close to the lower end of the working distance of the sensor.

16. The method of assembling an optoelectronic module according to claim 12 wherein said characterization comprises characterizing an optical sensor including at least two photodiodes, wherein the measurement results obtained in said measuring signals of said optical sensor against at least two reference surfaces corresponds to the difference of the signals output by said two photodiodes.

17. The method of assembling an optoelectronic module according to claim 16 wherein said measurement result is represented by $$\frac{\text{Current output by a first photodiode} - \text{Current output by a second photodiode}}{\text{Current output by a first photodiode} + \text{Current output by a second photodiode}}.$$

18. The method of assembling an optoelectronic module according to claim 12 wherein said characterization comprises characterizing an optical sensor including at least two photodiodes, wherein said intersection of curves for the respective one or more surfaces occurs when current output by a first photodiode substantively equals to current output by a second photodiode.

19. The method of assembling an optoelectronic module according to claim 12, wherein said calibration curve describes the relationship between the signal strength of said optical sensor and the distance that said optical sensor separates from said test surface.

* * * * *